(12) United States Patent
Liu (10) Patent No.: US 11,552,604 B2
(45) Date of Patent: Jan. 10, 2023

(54) BALUN DEVICE AND DIFFERENTIAL PHASE SHIFTER

(71) Applicant: SPREADTRUM COMMUNICATIONS (SHANGHAI) CO., LTD., Shanghai (CN)

(72) Inventor: Xuanhe Liu, Shanghai (CN)

(73) Assignee: SPREADTRUM COMMUNICATIONS (SHANGHAI) CO., LTD., Shanghai (CN)

( * ) Notice: Subject to any disclaimer, the term of this patent is extended or adjusted under 35 U.S.C. 154(b) by 188 days.

(21) Appl. No.: 17/011,442

(22) Filed: Sep. 3, 2020

(65) Prior Publication Data

US 2021/0408987 A1    Dec. 30, 2021

(30) Foreign Application Priority Data

Jun. 29, 2020 (CN) .......................... 202010600912.8

(51) Int. Cl.
  *H03F 3/45* (2006.01)
  *H01F 27/29* (2006.01)
  *H01F 27/42* (2006.01)

(52) U.S. Cl.
  CPC ......... *H03F 3/45179* (2013.01); *H01F 27/29* (2013.01); *H01F 27/42* (2013.01); *H03F 2200/09* (2013.01)

(58) Field of Classification Search
  CPC .. H03F 3/45179; H03F 2200/09; H01F 27/29; H01F 27/42; H01F 21/12; H01P 5/10; H01P 1/18
  USPC ..... 330/65–67, 79, 154, 165, 171, 188, 190, 330/195, 197, 276, 269, 275
  See application file for complete search history.

(56) References Cited

FOREIGN PATENT DOCUMENTS

| CN | 107124146 A | 9/2017 |
|----|-------------|--------|
| CN | 111082761 A | 4/2020 |

OTHER PUBLICATIONS

CNIPA First Office Action for corresponding CN Application No. 202010600912.8, dated Aug. 12, 2020.
Jung et al., "A CMOS Highly Linear Doherty Power Amplifier With Multigated Transistors," in IEEE Transactions on Microwave Theory and Techniques, vol. 67, No. 5, pp. 1883-1891; May 2019.

(Continued)

*Primary Examiner* — Samuel S Outten
*Assistant Examiner* — Khiem D Nguyen
(74) *Attorney, Agent, or Firm* — Cantor Colburn LLP (57) ABSTRACT

Balun device and differential phase shifter are provided. The balun device includes a first primary coil, a first secondary coil, a second primary coil and a second secondary coil, the first primary coil having a first terminal receiving a first differential signal, and a second terminal outputting a first in-phase component, the first secondary coil having a first terminal outputting a first component orthogonal to the first in-phase component, and a second terminal coupled to AC ground, the second primary coil having a first terminal receiving a second differential signal, and a second terminal outputting a second in-phase component; the second secondary coil having a first terminal outputting a second component orthogonal to the second in-phase component, and a second terminal coupled to AC ground; phase differences between the first and second differential signals, between the first and second in-phase components, between the first and second orthogonal component are 180°.

19 Claims, 2 Drawing Sheets

(56) References Cited

OTHER PUBLICATIONS

Nguyen et al., "A Coupler-Based Differential Doherty Power Amplifier With Built-In Baluns for High Mm-Wave Linear-Yet-Efficient Gbit/s Amplifications" in IEEE Radio Frequency Integrated Circuits Symposium (RFIC), pp. 195-1998, May 7, 2019.

Kim et al., "Design of 60 GHz Vector Modulator Based Active Phase Shifter", Sixth IEEE International Symposium on Electronic Design, Test and Application; 4 pages; dated: Mar. 10, 2011.

BALUN DEVICE AND DIFFERENTIAL PHASE SHIFTER

CROSS-REFERENCE TO RELATED APPLICATIONS

The present invention claims priority under 35 U.S.C. § 119 to Chinese Patent Application No. 202010600912.8, filed on Jun. 29, 2020, and entitled "BALUN DEVICE AND DIFFERENTIAL PHASE SHIFTER", the entire disclosure of which is incorporated herein by reference.

TECHNICAL FIELD

The present disclosure generally relates to communication technology field, and more particularly, to a balun device and a differential phase shifter.

BACKGROUND

In existing techniques, an active differential phase shifter converts two differential signals into four orthogonal differential signals through two balun devices, and then converts the four orthogonal differential signals into two orthogonal differential signals. As two balun devices are used, and a size of the balun devices is related to wavelength corresponding to operating frequency, the balun devices occupy a relatively large area.

SUMMARY

Embodiments of the present disclosure reduce the number of balun devices in a circuit.

In an embodiment, a balun device is provided, including a first primary coil, a first secondary coil, a second primary coil and a second secondary coil, wherein a first terminal of the first primary coil is configured to receive a first differential signal, and a second terminal of the first primary coil is configured to output a first in-phase component corresponding to the first differential signal; the first secondary coil corresponds to the first primary coil, a first terminal of the first secondary coil is configured to output a first orthogonal component orthogonal to the first in-phase component, and a second terminal of the first secondary coil is coupled to an AC ground; a first terminal of the second primary coil is configured to receive a second differential signal, and a second terminal of the second primary coil is configured to output a second in-phase component corresponding to the second differential signal; the second secondary coil corresponds to the second primary coil, a first terminal of the second secondary coil is configured to output a second orthogonal component orthogonal to the second in-phase component, and a second terminal of the second secondary coil is coupled to the AC ground; and a phase difference between the first differential signal and the second differential signal is 180°, a phase difference between the first in-phase component and the second in-phase component is 180°, and a phase difference between the first orthogonal component and the second orthogonal component is 180°.

In an embodiment, a differential phase shifter is provided, including the above balun device, an in-phase component gain amplifier, an orthogonal component gain amplifier and a transformer, wherein a first input terminal of the in-phase component gain amplifier is configured to receive the first in-phase component, a second input terminal of the in-phase component gain amplifier is configured to receive the second in-phase component, one of two output terminals of the in-phase component gain amplifier is coupled to a first terminal of a primary coil of the transformer, and the other of the two output terminals of the in-phase component gain amplifier is coupled to a second terminal of the primary coil of the transformer, a first input terminal of the orthogonal component gain amplifier is configured to receive the first orthogonal component, a second input terminal of the orthogonal component gain amplifier is configured to receive the second orthogonal component, one of two output terminals of the orthogonal component gain amplifier is coupled to the first terminal of the primary coil of the transformer, and the other of the two output terminals of the orthogonal component gain amplifier is coupled to the second terminal of the primary coil of the transformer; a secondary coil of the transformer is configured to output a phase shift signal; and an input signal at the first terminal of the primary coil of the transformer is orthogonal to an input signal at the second terminal of the primary coil of the transformer.

Optionally, the in-phase component gain amplifier includes at least one of a first amplifying unit or a second amplifying unit, wherein a first input terminal of the first amplifying unit is configured to receive the first in-phase component, a second input terminal of the first amplifying unit is configured to receive the second in-phase component, a first output terminal of the first amplifying unit is coupled to the first terminal of the primary coil of the transformer, and a second output terminal of the first amplifying unit is coupled to the second terminal of the primary coil of the transformer; and a first input terminal of the second amplifying unit is configured to receive the first in-phase component, a second input terminal of the second amplifying unit is configured to receive the second in-phase component, a first output terminal of the second amplifying unit is coupled to the first terminal of the primary coil of the transformer, and a second output terminal of the second amplifying unit is coupled to the second terminal of the primary coil of the transformer.

Optionally, the in-phase component gain amplifier further includes a first gain control unit, wherein when the in-phase component gain amplifier includes the first amplifying unit, an output terminal of the first gain control unit is coupled to a power terminal of the first amplifying unit, and an input terminal of the first gain control unit is configured to receive an in-phase component gain coefficient; when the in-phase component gain amplifier includes the second amplifying unit, the output terminal of the first gain control unit is coupled to a power terminal of the second amplifying unit, and the input terminal of the first gain control unit is configured to receive the in-phase component gain coefficient; and when the in-phase component gain amplifier includes the first amplifying unit and the second amplifying unit, the output terminal of the first gain control unit is coupled to the power terminal of the first amplifying unit and the power terminal of the second amplifying unit respectively, and the input terminal of the first gain control unit is configured to receive the in-phase component gain coefficient.

Optionally, when the in-phase component gain amplifier merely includes the first amplifying unit, the first amplifying unit includes a first NMOS transistor and a second NMOS transistor, wherein a gate of the first NMOS transistor is configured to receive the first in-phase component, a source of the first NMOS transistor is coupled to a DC ground, and a drain of the first NMOS transistor is the second output terminal of the first amplifying unit; and a gate of the second NMOS transistor is configured to receive the second in-phase component, a source of the second NMOS transistor is coupled to the DC ground, and a drain of the second NMOS transistor is the first output terminal of the first amplifying unit.

Optionally, the first gain control unit includes a third NMOS transistor and a fourth NMOS transistor, wherein a drain of the third NMOS transistor is coupled to the source of the first NMOS transistor and the source of the second NMOS transistor, a gate of the third NMOS transistor is configured to receive a preset bias voltage, and a source of the third NMOS transistor is coupled to a drain of the fourth NMOS transistor; and a gate of the fourth NMOS transistor is configured to receive the in-phase component gain coefficient, and a source of the fourth NMOS transistor is coupled to the DC ground.

Optionally, when the in-phase component gain amplifier merely includes the second amplifying unit, the second amplifying unit includes a fifth NMOS transistor and a sixth NMOS transistor, wherein a gate of the fifth NMOS transistor is configured to receive the first in-phase component, a source of the fifth NMOS transistor is coupled to a DC ground, and a drain of the fifth NMOS transistor is the first output terminal of the second amplifying unit; and a gate of the sixth NMOS transistor is configured to receive the second in-phase component, a source of the sixth NMOS transistor is coupled to the DC ground, and a drain of the sixth NMOS transistor is the second output terminal of the second amplifying unit.

Optionally, the first gain control unit includes a fourth NMOS transistor and a seventh NMOS transistor, wherein a drain of the seventh NMOS transistor is coupled to the source of the fifth NMOS transistor and the source of the sixth NMOS transistor, a gate of the seventh NMOS transistor is configured to receive a preset bias voltage, and a source of the seventh NMOS transistor is coupled to a drain of the fourth NMOS transistor, and a gate of the fourth NMOS transistor is configured to receive the in-phase component gain coefficient, and a source of the fourth NMOS transistor is coupled to the DC ground.

Optionally, the in-phase component gain amplifier includes the first amplifying unit and the second amplifying unit, wherein the first amplifying unit includes a first NMOS transistor and a second NMOS transistor, wherein a gate of the first NMOS transistor is configured to receive the first in-phase component, a source of the first NMOS transistor is coupled to a DC ground, a drain of the first NMOS transistor is the second output terminal of the first amplifying unit, a gate of the second NMOS transistor is configured to receive the second in-phase component, a source of the second NMOS transistor is coupled to the DC ground, and a drain of the second NMOS transistor is the first output terminal of the first amplifying unit; and the second amplifying unit includes a fifth NMOS transistor and a sixth NMOS transistor, wherein a gate of the fifth NMOS transistor is configured to receive the first in-phase component, a source of the fifth NMOS transistor is coupled to the DC ground, a drain of the fifth NMOS transistor is the first output terminal of the second amplifying unit, a gate of the sixth NMOS transistor is configured to receive the second in-phase component, a source of the sixth NMOS transistor is coupled to the DC ground, and a drain of the sixth NMOS transistor is the second output terminal of the second amplifying unit.

Optionally, the first gain control unit includes a third NMOS transistor, a fourth NMOS transistor, a seventh NMOS transistor, a first switch circuit, a second switch circuit, a third switch circuit and a fourth switch circuit, wherein a drain of the third NMOS transistor is coupled to the source of the first NMOS transistor and the source of the second NMOS transistor, a gate of the third NMOS transistor is coupled to a first terminal of the first switch circuit and a first terminal of the second switch circuit, and a source of the third NMOS transistor is coupled to a drain of the fourth NMOS transistor; a drain of the seventh NMOS transistor is coupled to the source of the fifth NMOS transistor and the source of the sixth NMOS transistor, a gate of the seventh NMOS transistor is coupled to a first terminal of the third switch circuit and a first terminal of the fourth switch circuit, and a source of the seventh NMOS transistor is coupled to the drain of the fourth NMOS transistor; a gate of the fourth NMOS transistor is configured to receive the in-phase component gain coefficient, and a source of the fourth NMOS transistor is coupled to the DC ground; a second terminal of the first switch circuit is configured to receive a preset bias voltage; a second terminal of the second switch circuit is coupled to the DC ground; a second terminal of the third switch circuit is coupled to the DC ground; and a second terminal of the fourth switch circuit is configured to receive the preset bias voltage.

Optionally, the orthogonal component gain amplifier includes at least one of a third amplifying unit or a fourth amplifying unit, wherein a first input terminal of the third amplifying unit is configured to receive the first orthogonal component, a second input terminal of the third amplifying unit is configured to receive the second orthogonal component, a first output terminal of the third amplifying unit is coupled to the first terminal of the primary coil of the transformer, and a second output terminal of the third amplifying unit is coupled to the second terminal of the primary coil of the transformer; and a first input terminal of the fourth amplifying unit is configured to receive the second orthogonal component, a second input terminal of the fourth amplifying unit is configured to receive the first orthogonal component, a first output terminal of the fourth amplifying unit is coupled to the second terminal of the primary coil of the transformer, and a second output terminal of the fourth amplifying unit is coupled to the first terminal of the primary coil of the transformer.

Optionally, the orthogonal component gain amplifier further includes a second gain control unit, when the orthogonal component gain amplifier includes the third amplifying unit, an output terminal of the second gain control unit is coupled to a power terminal of the third amplifying unit, and an input terminal of the second gain control unit is configured to receive an orthogonal component gain coefficient; when the orthogonal component gain amplifier includes the fourth amplifying unit, the output terminal of the second gain control unit is coupled to a power terminal of the fourth amplifying unit, and the input terminal of the second gain control unit is configured to receive the orthogonal component gain coefficient; and when the orthogonal component gain amplifier includes the third amplifying unit and the fourth amplifying unit, the output terminal of the second gain control unit is coupled to the power terminal of the third amplifying unit and the power terminal of the fourth amplifying unit respectively, and the input terminal of the second gain control unit is configured to receive the orthogonal component gain coefficient.

Optionally, when the orthogonal component gain amplifier merely includes the third amplifying unit, the third amplifying unit includes an eighth NMOS transistor and a ninth NMOS transistor, wherein a gate of the eighth NMOS transistor is configured to receive the first orthogonal component, a source of the eighth NMOS transistor is coupled to a DC ground, and a drain of the eighth NMOS transistor is the second output terminal of the third amplifying unit; and a gate of the ninth NMOS transistor is configured to receive the second orthogonal component, a source of the ninth NMOS transistor is coupled to the DC ground, and a drain of the ninth NMOS transistor is the first output terminal of the third amplifying unit.

Optionally, the second gain control unit includes a tenth NMOS transistor and an eleventh NMOS transistor, wherein a drain of the tenth NMOS transistor is coupled to the source of the eighth NMOS transistor and the source of the ninth NMOS transistor, a gate of the tenth NMOS transistor is configured to receive a preset bias voltage, and a source of the tenth NMOS transistor is coupled to a drain of the eleventh NMOS transistor; and a gate of the eleventh NMOS transistor is configured to receive the orthogonal component gain coefficient, and a source of the eleventh NMOS transistor is coupled to the DC ground.

Optionally, when the orthogonal component gain amplifier merely includes the fourth amplifying unit, the fourth amplifying unit includes a twelfth NMOS transistor and a thirteenth NMOS transistor, wherein a gate of the twelfth NMOS transistor is configured to receive the first orthogonal component, a source of the twelfth NMOS transistor is coupled to a DC ground, and a drain of the twelfth NMOS transistor is the first output terminal of the fourth amplifying unit; and a gate of the thirteenth NMOS transistor is configured to receive the second orthogonal component, a source of the thirteenth NMOS transistor is coupled to the DC ground, and a drain of the thirteenth NMOS transistor is the second output terminal of the fourth amplifying unit.

Optionally, the second gain control unit includes an eleventh NMOS transistor and a fourteenth NMOS transistor, wherein a drain of the fourteenth NMOS transistor is coupled to the source of the twelfth NMOS transistor and the source of the thirteenth NMOS transistor, a gate of the fourteenth NMOS transistor is configured to receive a preset bias voltage, and a source of the fourteenth NMOS transistor is coupled to a drain of the eleventh NMOS transistor; and a gate of the eleventh NMOS transistor is configured to receive the orthogonal component gain coefficient, and a source of the eleventh NMOS transistor is coupled to the DC ground.

Optionally, the orthogonal component gain amplifier includes the third amplifying unit and the fourth amplifying unit, wherein the third amplifying unit includes an eighth NMOS transistor and a ninth NMOS transistor, wherein a gate of the eighth NMOS transistor is configured to receive the first orthogonal component, a source of the eighth NMOS transistor is coupled to a DC ground, a drain of the eighth NMOS transistor is the second output terminal of the third amplifying unit, a gate of the ninth NMOS transistor is configured to receive the second orthogonal component, a source of the ninth NMOS transistor is coupled to the DC ground, and a drain of the ninth NMOS transistor is the first output terminal of the third amplifying unit; and the fourth amplifying unit includes a twelfth NMOS transistor and a thirteenth NMOS transistor, wherein a gate of the twelfth NMOS transistor is configured to receive the first orthogonal component, a source of the twelfth NMOS transistor is coupled to the DC ground, a drain of the twelfth NMOS transistor is the first output terminal of the fourth amplifying unit, a gate of the thirteenth NMOS transistor is configured to receive the second orthogonal component, a source of the thirteenth NMOS transistor is coupled to the DC ground, and a drain of the thirteenth NMOS transistor is the second output terminal of the fourth amplifying unit.

Optionally, the second gain control unit includes a tenth NMOS transistor, an eleventh NMOS transistor, a fourteenth NMOS transistor, a fifth switch circuit, a sixth switch circuit, a seventh switch circuit and an eighth switch circuit, wherein a drain of the tenth NMOS transistor is coupled to the source of the eighth NMOS transistor and the source of the ninth NMOS transistor, a gate of the tenth NMOS transistor is coupled to a first terminal of the fifth switch circuit and a first terminal of the sixth switch circuit, and a source of the tenth NMOS transistor is coupled to a drain of the eleventh NMOS transistor; a drain of the fourteenth NMOS transistor is coupled to the source of the twelfth NMOS transistor and the source of the thirteenth NMOS transistor, a gate of the fourteenth NMOS transistor is coupled to a first terminal of the seventh switch circuit and a first terminal of the eighth switch circuit, and a source of the fourteenth NMOS transistor is coupled to the drain of the eleventh NMOS transistor; a gate of the eleventh NMOS transistor is configured to receive the in-phase component gain coefficient, and a source of the eleventh NMOS transistor is coupled to the DC ground; a second terminal of the fifth switch circuit is configured to receive a preset bias voltage; a second terminal of the sixth switch circuit is coupled to the DC ground; a second terminal of the seventh switch circuit is coupled to the DC ground; and a second terminal of the eighth switch circuit is configured to receive the preset bias voltage.

Optionally, a center point of the primary coil of the transformer is coupled to a DC voltage source.

Embodiments of the present disclosure may provide following advantages.

In embodiments of the present disclosure, the balun device includes a first primary coil, a first secondary coil, a second primary coil and a second secondary coil, wherein a first terminal of the first primary coil is configured to receive a first differential signal, a second terminal of the first primary coil is configured to output a first in-phase component corresponding to the first differential signal, a first terminal of the first secondary coil is configured to output a first orthogonal component orthogonal to the first in-phase component, a first terminal of the second primary coil is configured to receive a second differential signal, a second terminal of the second primary coil is configured to output a second in-phase component corresponding to the second differential signal, and a first terminal of the second secondary coil is configured to output a second orthogonal component orthogonal to the second in-phase component. In this way, four orthogonal differential signals can be output using one balun device, which effectively reduces the number of balun devices in a differential phase shifter.

Further, by setting the first gain control unit and the second gain control unit, amplification gain coefficients of in-phase components and amplification gain coefficients of orthogonal components are adjusted respectively, and further a gain and an output phase of the in-phase component gain amplifier, and a gain and an output phase of the orthogonal component gain amplifier are adjusted accordingly, so as to achieve a phase shift of 360°.

DETAILED DESCRIPTION

Figure 1:
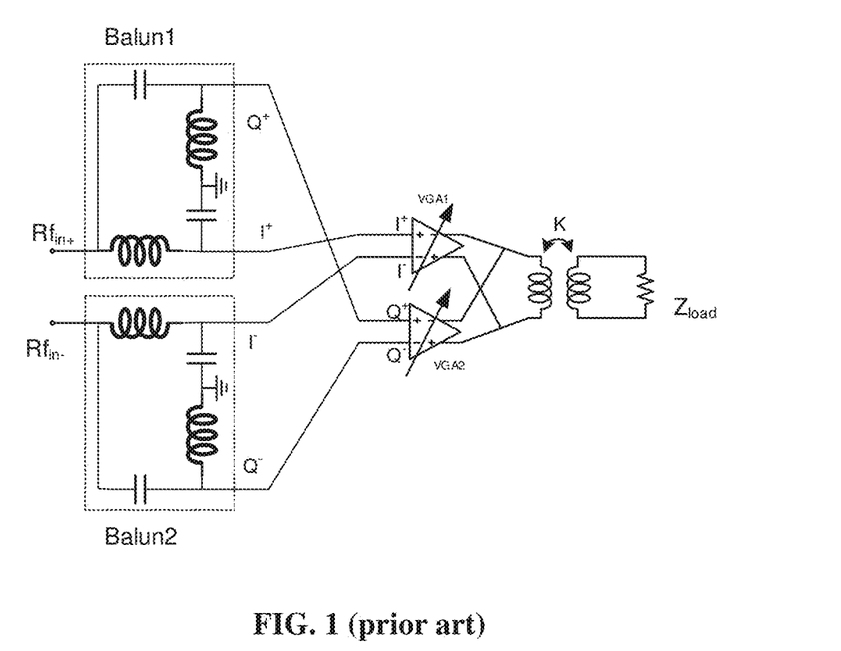
FIG. 1 schematically illustrates a circuit structure of an active differential phase shifter in existing techniques.

Referring to FIG. 1, FIG. 1 schematically illustrates a circuit structure of an active differential phase shifter in existing techniques. In the existing techniques, the active differential phase shifter uses two balun devices (Balun1, Balun2) to convert two differential signals $Rf_{in+}$ and $Rf_{in-}$ into four orthogonal differential signals ($I^+$, $I^-$, $Q^+$, $Q^-$) and output them to two variable differential amplifiers (VGA1, VGA2) respectively. The variable differential amplifiers amplify the corresponding orthogonal differential signals and input them to a primary coil of a transformer. K is a transformation ratio of the transformer, and a secondary coil of the transformer carries a load $Z_{load}$.

From FIG. 1, in the existing techniques, the active differential phase shifter converts two differential signals into four orthogonal differential signals through two balun devices, and then converts the four orthogonal differential signals into two orthogonal differential signals. As two balun devices are used, and a size of the balun devices is related to wavelength corresponding to operating frequency, the balun devices occupy a relatively large area.

In embodiments of the present disclosure, the balun device includes a first primary coil, a first secondary coil, a second primary coil and a second secondary coil, wherein a first terminal of the first primary coil is configured to receive a first differential signal, a second terminal of the first primary coil is configured to output a first in-phase component corresponding to the first differential signal, a first terminal of the first secondary coil is configured to output a first orthogonal component orthogonal to the first in-phase component, a first terminal of the second primary coil is configured to receive a second differential signal, a second terminal of the second primary coil is configured to output a second in-phase component corresponding to the second differential signal, and a first terminal of the second secondary coil is configured to output a second orthogonal component orthogonal to the second in-phase component. In this way, four orthogonal differential signals can be output using one balun device, which effectively reduces the number of balun devices in a differential phase shifter.

In order to clarify the object, solutions and advantages of embodiments of the present disclosure, embodiments of present disclosure will be described explicitly in detail in conjunction with accompanying drawings.

Figure 2:
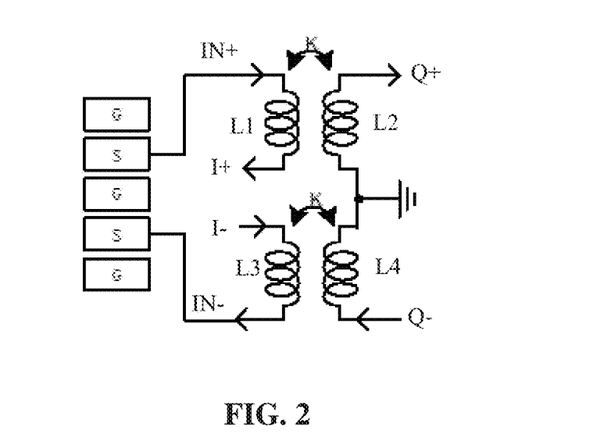
FIG. 2 schematically illustrates a circuit structure of a balun device according to an embodiment.

FIG. 2 schematically illustrates a circuit structure of a balun device according to an embodiment.

In the embodiment, the balun device includes a first primary coil L1, a first secondary coil L2, a second primary coil L3 and a second secondary coil L4. A first terminal of the first primary coil L1 is configured to receive a first differential signal IN+, and a second terminal of the first primary coil L1 is configured to output a first in-phase component I+ corresponding to the first differential signal IN+; the first secondary coil L2 corresponds to the first primary coil L1, a first terminal of the first secondary coil L2 is configured to output a first orthogonal component Q+ orthogonal to the first in-phase component I+, and a second terminal of the first secondary coil L2 is coupled to an AC ground; a first terminal of the second primary coil L3 is configured to receive a second differential signal IN-, and a second terminal of the second primary coil L3 is configured to output a second in-phase component I- corresponding to the second differential signal IN-; the second secondary coil L4 corresponds to the second primary coil L3, a first terminal of the second secondary coil L4 is configured to output a second orthogonal component Q- orthogonal to the second in-phase component I-, and a second terminal of the second secondary coil L4 is coupled to the AC ground.

In FIG. 2, G and S are interfaces, where G is the ground, and S is a signal input interface.

In some embodiments, a phase difference between the first differential signal IN+ and the second differential signal IN- is 180°, a phase difference between the first in-phase component I+ and the second in-phase component I- is 180°, and a phase difference between the first orthogonal component Q+ and the second orthogonal component Q- is 180°.

In some embodiments, the first differential signal IN+ and the second differential signal IN- may be obtained after differential conversion of a single-ended signal. Specific principles and circuit structures of converting a single-ended signal into a differential signal may be referred to existing solutions, and are not described in detail here.

In some embodiments, a phase of the first differential signal IN+ may be 0°, and accordingly a phase of the second differential signal IN- may be -180°. A phase of the first in-phase component I+ corresponding to the first differential signal IN+ is 0°, and a phase of the first orthogonal component Q+ orthogonal to the first in-phase component I+ is 90°. A phase of the second in-phase component I- corresponding to the second differential signal IN- is -180°, and a phase of the second orthogonal component Q- orthogonal to the second in-phase component I- is -90°.

Figure 3:
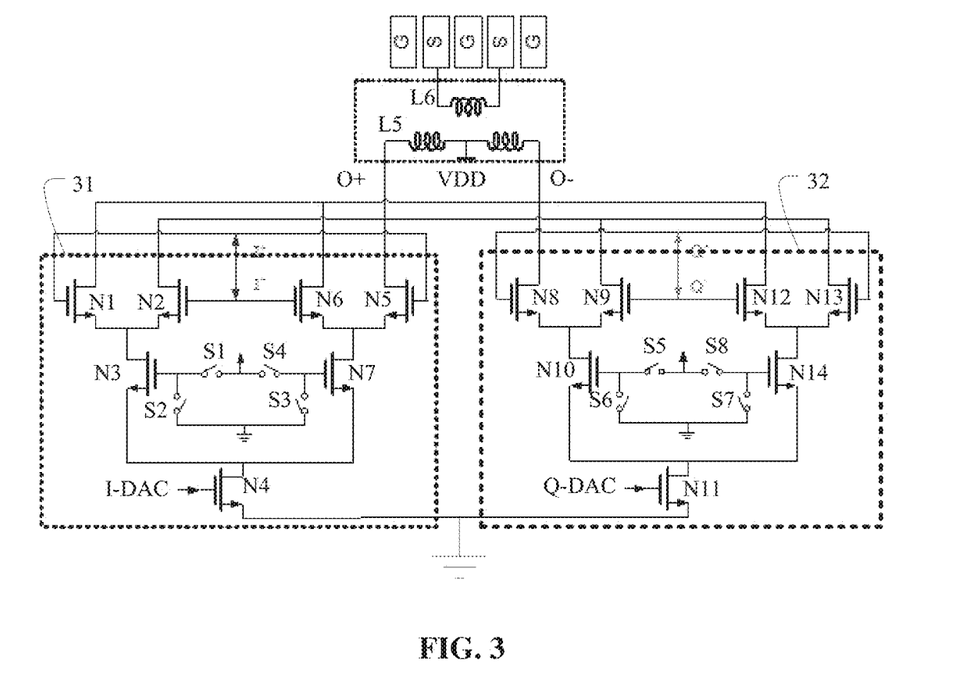
FIG. 3 schematically illustrates a circuit structure of a differential phase shifter according to an embodiment.

FIG. 3 schematically illustrates a circuit structure of a differential phase shifter according to an embodiment. The differential phase shifter provided in the embodiment of the present disclosure is described in detail below. It should be noted that FIG. 3 does not illustrate the balun device provided in the foregoing embodiment of the present disclosure, but merely illustrates a relation between a signal output of the balun device provided in the foregoing embodiment and the in-phase component gain amplifier 31 and the orthogonal component gain amplifier 32.

In some embodiments, the differential phase shifter includes a balun device, an in-phase component gain amplifier 31, an orthogonal component gain amplifier 32 and a transformer. A first input terminal of the in-phase component gain amplifier 31 is configured to receive the first in-phase component I+, a second input terminal of the in-phase component gain amplifier 31 is configured to receive the second in-phase component I-, one of two output terminals of the in-phase component gain amplifier 31 is coupled to a first terminal O+ of a primary coil L5 of the transformer, and the other of the two output terminals of the in-phase component gain amplifier 31 is coupled to a second terminal O- of the primary coil L5 of the transformer. A first input terminal of the orthogonal component gain amplifier 32 is configured to receive the first orthogonal component Q+, a second input terminal of the orthogonal component gain amplifier 32 is configured to receive the second orthogonal component Q-, one of two output terminals of the orthogonal component gain amplifier 32 is coupled to the first terminal O+ of the primary coil L5 of the transformer, and the other of the two output terminals of the orthogonal component gain amplifier 32 is coupled to the second terminal O- of the primary coil L5 of the transformer. A secondary coil L6 of the transformer is configured to output a phase shift signal which may include two differential signals.

In some embodiments, an input signal at the first terminal O+ of the primary coil L5 of the transformer is orthogonal to an input signal at the second terminal O− of the primary coil L5 of the transformer. In embodiments of the present disclosure, one signal being orthogonal to another signal means that a phase difference between the two signals is 90°.

In some embodiments, the in-phase component gain amplifier 31 merely includes a first amplifying unit, where a first input terminal of the first amplifying unit is configured to receive the first in-phase component I+, a second input terminal of the first amplifying unit is configured to receive the second in-phase component I−, a first output terminal of the first amplifying unit is coupled to the first terminal O+ of the primary coil L5 of the transformer, and a second output terminal of the first amplifying unit is coupled to the second terminal O− of the primary coil L5 of the transformer.

In some embodiments, when the in-phase component gain amplifier 31 merely includes the first amplifying unit, the first amplifying unit includes a first NMOS transistor N1 and a second NMOS transistor N2, wherein a gate of the first NMOS transistor N1 is configured to receive the first in-phase component I+, a source of the first NMOS transistor N1 is coupled to a DC ground, and a drain of the first NMOS transistor N1 is the second output terminal of the first amplifying unit; and a gate of the second NMOS transistor N2 is configured to receive the second in-phase component I−, a source of the second NMOS transistor N2 is coupled to the DC ground, and a drain of the second NMOS transistor N2 is the first output terminal of the first amplifying unit.

Referring to FIG. 3, when the in-phase component gain amplifier 31 merely includes the first amplifying unit, the first amplifying unit merely includes the first NMOS transistor N1 and the second NMOS transistor N2, and does not include other components in FIG. 3.

In some embodiments, the in-phase component gain amplifier 31 merely includes a second amplifying unit, where a first input terminal of the second amplifying unit is configured to receive the first in-phase component I+, a second input terminal of the second amplifying unit is configured to receive the second in-phase component I−, a first output terminal of the second amplifying unit is coupled to the first terminal O+ of the primary coil L5 of the transformer, and a second output terminal of the second amplifying unit is coupled to the second terminal O− of the primary coil L5 of the transformer.

In some embodiments, when the in-phase component gain amplifier 31 merely includes the second amplifying unit, the second amplifying unit includes a fifth NMOS transistor N5 and a sixth NMOS transistor N6, wherein a gate of the fifth NMOS transistor N5 is configured to receive the first in-phase component I+, a source of the fifth NMOS transistor N5 is coupled to a DC ground, and a drain of the fifth NMOS transistor N5 is the first output terminal of the second amplifying unit; and a gate of the sixth NMOS transistor N6 is configured to receive the second in-phase component I−, a source of the sixth NMOS transistor N6 is coupled to the DC ground, and a drain of the sixth NMOS transistor N6 is the second output terminal of the second amplifying unit.

Referring to FIG. 3, when the in-phase component gain amplifier 31 merely includes the second amplifying unit, the second amplifying unit merely includes the fifth NMOS transistor N5 and the sixth NMOS transistor N6, and does not include other components in FIG. 3.

In some embodiments, the in-phase component gain amplifier 31 includes the first amplifying unit and the second amplifying unit. Referring to FIG. 3, the first amplifying unit includes the first NMOS transistor N1 and the second NMOS transistor N2, and the second amplifying unit includes the fifth NMOS transistor N5 and the sixth NMOS transistor N6. Specific circuit structures of the first amplifying unit can be referred to the foregoing description of the first amplifying unit, and specific circuit structures of the second amplifying unit can be referred to the foregoing description of the second amplifying unit.

In some embodiments, the in-phase component gain amplifier 31 further includes a first gain control unit.

In some embodiments, when the in-phase component gain amplifier 31 merely includes the first amplifying unit, an output terminal of the first gain control unit is coupled to a power terminal of the first amplifying unit, and an input terminal of the first gain control unit is configured to receive an in-phase component gain coefficient.

When the in-phase component gain amplifier 31 merely includes the first amplifying unit, the first gain control unit includes a third NMOS transistor N3 and a fourth NMOS transistor N4, wherein a drain of the third NMOS transistor N3 is coupled to the source of the first NMOS transistor N1 and the source of the second NMOS transistor N2, a gate of the third NMOS transistor N3 is configured to receive a preset bias voltage, and a source of the third NMOS transistor N3 is coupled to a drain of the fourth NMOS transistor N4; and a gate of the fourth NMOS transistor N4 is configured to receive the in-phase component gain coefficient, and a source of the fourth NMOS transistor N4 is coupled to the DC ground.

In some embodiments, when the in-phase component gain amplifier 31 merely includes the second amplifying unit, the output terminal of the first gain control unit is coupled to a power terminal of the second amplifying unit, and the input terminal of the first gain control unit is configured to receive the in-phase component gain coefficient.

When the in-phase component gain amplifier 31 merely includes the second amplifying unit, the first gain control unit includes a fourth NMOS transistor N4 and a seventh NMOS transistor N7, wherein a drain of the seventh NMOS transistor N7 is coupled to the source of the fifth NMOS transistor N5 and the source of the sixth NMOS transistor N6, a gate of the seventh NMOS transistor N7 is configured to receive a preset bias voltage, and a source of the seventh NMOS transistor N7 is coupled to a drain of the fourth NMOS transistor N4; and a gate of the fourth NMOS transistor N4 is configured to receive the in-phase component gain coefficient, and a source of the fourth NMOS transistor N4 is coupled to the DC ground.

In some embodiments, when the in-phase component gain amplifier 31 includes the first amplifying unit and the second amplifying unit, the output terminal of the first gain control unit is coupled to the power terminal of the first amplifying unit and the power terminal of the second amplifying unit respectively, and the input terminal of the first gain control unit is configured to receive the in-phase component gain coefficient.

In some embodiments, when the in-phase component gain amplifier 31 includes the first amplifying unit and the second amplifying unit, the first gain control unit includes the third NMOS transistor N3, the fourth NMOS transistor N4, the seventh NMOS transistor N7, the first switch circuit S1, a second switch circuit S2, a third switch circuit S3 and a fourth switch circuit S4, wherein a drain of the third NMOS transistor N3 is coupled to the source of the first NMOS transistor N1 and the source of the second NMOS transistor N2, a gate of the third NMOS transistor N3 is coupled to a first terminal of the first switch circuit S1 and a first terminal of the second switch circuit S2, and a source of the third NMOS transistor N3 is coupled to a drain of the fourth NMOS transistor N4; a drain of the seventh NMOS transistor N7 is coupled to the source of the fifth NMOS transistor N5 and the source of the sixth NMOS transistor N6, a gate of the seventh NMOS transistor N7 is coupled to a first terminal of the third switch circuit S3 and a first terminal of the fourth switch circuit S4, and a source of the seventh NMOS transistor N7 is coupled to the drain of the fourth NMOS transistor N4; a drain of the fourth NMOS transistor N4 is coupled to the source of the third NMOS transistor N3 and the source of the seventh NMOS transistor N7, a gate of the fourth NMOS transistor N4 is configured to receive the in-phase component gain coefficient, and a source of the fourth NMOS transistor N4 is coupled to the DC ground; a second terminal of the first switch circuit S1 is configured to receive a preset bias voltage; a second terminal of the second switch circuit S2 is coupled to the DC ground; a second terminal of the third switch circuit S3 is coupled to the DC ground; and a second terminal of the fourth switch circuit S4 is configured to receive the preset bias voltage.

In some embodiments, when the in-phase component gain amplifier 31 includes the first switch circuit S1 and the second switch circuit S2, at the same time, merely one of the first switch circuit S1 and the second switch circuit S2 is in an operating state, and the other is in an off state.

When the first gain control unit includes a first switch circuit S1, a second switch circuit S2, a third switch circuit S3 and a fourth switch circuit S4, the first switch circuit S1 and the third switch circuit S3 are simultaneously turned on or off, and the second switch circuit S2 and the fourth switch circuit S4 are simultaneously turned on or off. Besides, when the first switch circuit S1 and the third switch circuit S3 are in an on state, the second switch circuit S2 and the fourth switch circuit S4 are in an off state, and when the second switch circuit S2 and the fourth switch circuit S4 are in the on state, the first switch circuit S1 and the third switch circuit S3 are in the off state.

In some embodiments, the orthogonal component gain amplifier 32 merely includes a third amplifying unit. A first input terminal of the third amplifying unit is configured to receive the first orthogonal component Q+, a second input terminal of the third amplifying unit is configured to receive the second orthogonal component Q−, a first output terminal of the third amplifying unit is coupled to the first terminal O+ of the primary coil L5 of the transformer, and a second output terminal of the third amplifying unit is coupled to the second terminal O− of the primary coil L5 of the transformer.

In some embodiments, when the orthogonal component gain amplifier 32 merely includes the third amplifying unit, the third amplifying unit includes an eighth NMOS transistor N8 and a ninth NMOS transistor N9, wherein a gate of the eighth NMOS transistor N8 is configured to receive the first orthogonal component Q+, a source of the eighth NMOS transistor N8 is coupled to a DC ground, and a drain of the eighth NMOS transistor N8 is the second output terminal of the third amplifying unit; and a gate of the ninth NMOS transistor N8 is configured to receive the second orthogonal component Q−, a source of the ninth NMOS transistor N9 is coupled to the DC ground, and a drain of the ninth NMOS transistor N9 is the first output terminal of the third amplifying unit.

Referring to FIG. 3, when the orthogonal component gain amplifier 32 merely includes the third amplifying unit, the third amplifying unit merely includes the eighth NMOS transistor N8 and the ninth NMOS transistor N9, and does not include other components in FIG. 3.

In some embodiments, the orthogonal component gain amplifier 32 merely includes a fourth amplifying unit. A first input terminal of the fourth amplifying unit is configured to receive the second orthogonal component Q−, a second input terminal of the fourth amplifying unit is configured to receive the first orthogonal component Q+, a first output terminal of the fourth amplifying unit is coupled to the second terminal O− of the primary coil L5 of the transformer, and a second output terminal of the fourth amplifying unit is coupled to the first terminal O+ of the primary coil L5 of the transformer.

In some embodiments, when the orthogonal component gain amplifier 32 merely includes the fourth amplifying unit, the fourth amplifying unit includes a twelfth NMOS transistor N12 and a thirteenth NMOS transistor N13, wherein a gate of the twelfth NMOS transistor N12 is configured to receive the first orthogonal component Q+, a source of the twelfth NMOS transistor N12 is coupled to a DC ground, and a drain of the twelfth NMOS transistor N12 is the first output terminal of the fourth amplifying unit; and a gate of the thirteenth NMOS transistor N13 is configured to receive the second orthogonal component Q−, a source of the thirteenth NMOS transistor N13 is coupled to the DC ground, and a drain of the thirteenth NMOS transistor N13 is the second output terminal of the fourth amplifying unit.

Referring to FIG. 3, when the orthogonal component gain amplifier 32 merely includes the fourth amplifying unit, the fourth amplifying unit merely includes the twelfth NMOS transistor N12 and the thirteenth NMOS transistor N13, and does not include other components in FIG. 3.

In some embodiments, the orthogonal component gain amplifier 32 includes the third amplifying unit and the fourth amplifying unit. Referring to FIG. 3, the third amplifying unit includes the eighth NMOS transistor N8 and the ninth NMOS transistor N9, and the fourth amplifying unit includes the twelfth NMOS transistor N12 and the thirteenth NMOS transistor N13. Specific circuit structures of the third amplifying unit can be referred to the foregoing description of the third amplifying unit, and specific circuit structures of the fourth amplifying unit can be referred to the foregoing description of the fourth amplifying unit.

In some embodiments, the orthogonal component gain amplifier 32 further includes a second gain control unit.

In some embodiments, when the orthogonal component gain amplifier 32 merely includes the third amplifying unit, an output terminal of the second gain control unit is coupled to a power terminal of the third amplifying unit, and an input terminal of the second gain control unit is configured to receive an orthogonal component gain coefficient.

In some embodiments, when the orthogonal component gain amplifier 32 merely includes the third amplifying unit, the second gain control unit includes a tenth NMOS transistor N10 and an eleventh NMOS transistor N11, wherein a drain of the tenth NMOS transistor N10 is coupled to the source of the eighth NMOS transistor N8 and the source of the ninth NMOS transistor N9, a gate of the tenth NMOS transistor N10 is configured to receive a preset bias voltage, and a source of the tenth NMOS transistor N10 is coupled to a drain of the eleventh NMOS transistor N11; and a gate of the eleventh NMOS transistor N11 is configured to receive the orthogonal component gain coefficient, and a source of the eleventh NMOS transistor N11 is coupled to the DC ground.

In some embodiments, when the orthogonal component gain amplifier 32 merely includes the fourth amplifying unit, the output terminal of the second gain control unit is coupled to a power terminal of the fourth amplifying unit, and the input terminal of the second gain control unit is configured to receive the orthogonal component gain coefficient.

In some embodiments, when the orthogonal component gain amplifier 32 merely includes the fourth amplifying unit, the second gain control unit includes an eleventh NMOS transistor N11 and a fourteenth NMOS transistor N14, wherein a drain of the fourteenth NMOS transistor N14 is coupled to the source of the twelfth NMOS transistor N12 and the source of the thirteenth NMOS transistor N13, a gate of the fourteenth NMOS transistor N14 is configured to receive a preset bias voltage, and a source of the fourteenth NMOS transistor N14 is coupled to a drain of the eleventh NMOS transistor N11; and a gate of the eleventh NMOS transistor N11 is configured to receive the orthogonal component gain coefficient, and a source of the eleventh NMOS transistor N11 is coupled to the DC ground.

In some embodiments, when the orthogonal component gain amplifier 32 includes the third amplifying unit and the fourth amplifying unit, the output terminal of the second gain control unit is coupled to the power terminal of the third amplifying unit and the power terminal of the fourth amplifying unit respectively, and the input terminal of the second gain control unit is configured to receive the orthogonal component gain coefficient.

In some embodiments, when the orthogonal component gain amplifier 32 includes the third amplifying unit and the fourth amplifying unit, the second gain control unit includes a tenth NMOS transistor N10, an eleventh NMOS transistor N11, a fourteenth NMOS transistor N14, a fifth switch circuit S5, a sixth switch circuit S6, a seventh switch circuit S7 and an eighth switch circuit S8, wherein a drain of the tenth NMOS transistor N10 is coupled to the source of the eighth NMOS transistor N8 and the source of the ninth NMOS transistor N9, a gate of the tenth NMOS transistor N10 is coupled to a first terminal of the fifth switch circuit S5 and a first terminal of the sixth switch circuit S6, and a source of the tenth NMOS transistor N10 is coupled to a drain of the eleventh NMOS transistor N11; a drain of the fourteenth NMOS transistor N14 is coupled to the source of the twelfth NMOS transistor N12 and the source of the thirteenth NMOS transistor N13, a gate of the fourteenth NMOS transistor N14 is coupled to a first terminal of the seventh switch circuit S7 and a first terminal of the eighth switch circuit S8, and a source of the fourteenth NMOS transistor N14 is coupled to the drain of the eleventh NMOS transistor N11; a drain of the eleventh NMOS transistor N11 is coupled to the source of the tenth NMOS transistor N10 and the source of the fourteenth NMOS transistor N14, a gate of the eleventh NMOS transistor N11 is configured to receive the in-phase component gain coefficient, and a source of the eleventh NMOS transistor N11 is coupled to the DC ground; a second terminal of the fifth switch circuit S5 is configured to receive a preset bias voltage; a second terminal of the sixth switch circuit S6 is coupled to the DC ground; a second terminal of the seventh switch circuit S7 is coupled to the DC ground; and a second terminal of the eighth switch circuit S8 is configured to receive the preset bias voltage.

In some embodiments, when the orthogonal component gain amplifier 32 includes the fifth switch circuit S5 and the sixth switch circuit S6, at the same time, merely one of the fifth switch circuit S5 and the sixth switch circuit S6 is in an operating state, and the other is in an off state.

When the second gain control unit includes a fifth switch circuit S5, a sixth switch circuit S6, a seventh switch circuit S7 and an eighth switch circuit S8, the fifth switch circuit S5 and the seventh switch circuit S7 are simultaneously turned on or off, and the sixth switch circuit S6 and the eighth switch circuit S8 are simultaneously turned on or off. Besides, when the fifth switch circuit S5 and the seventh switch circuit S7 are in an on state, the sixth switch circuit S6 and the eighth switch circuit S8 are in an off state, and when the sixth switch circuit S6 and the eighth switch circuit S8 are in the on state, the fifth switch circuit S5 and the seventh switch circuit S7 are in the off state.

In practice, the in-phase component gain coefficient may be input according to specific application scenarios. In the embodiments of the present disclosure, the in-phase component gain coefficient may be determined by an input current. As shown in FIG. 3, the in-phase component gain coefficient is determined by a current I-DAC input to the gate of the fourth NMOS transistor N4. The magnitude of the current input to the gate of the fourth NMOS transistor N4 corresponds to different in-phase component gain coefficients.

In FIG. 3, G and S are interfaces, where G is the ground, and S is a signal input interface.

Accordingly, the orthogonal component gain coefficient may also be determined by the input current value. As shown in FIG. 3, the orthogonal component gain coefficient is determined by the current Q-DAC input to the gate of the eleventh NMOS transistor N11. The magnitude of the current input to the gate of the eleventh NMOS transistor N11 corresponds to different in-phase component gain coefficients.

In some embodiments, a DC voltage source VDD is coupled to a center point of the primary coil L5 of the transformer. Inductance at the left of the center point is positive, and inductance at the right of the center point is negative.

From above, embodiments of the present disclosure provide a balun device, where the first differential signal IN+ and the second differential signal IN− are input into the two input terminals respectively, and four orthogonal differential signals are output. The balun device can be used in the differential phase shifter to reduce the number of balun devices in the differential phase shifter, which reduces an area occupied by balun devices.

Although the present disclosure has been disclosed above with reference to preferred embodiments thereof, it should be understood that the disclosure is presented by way of example merely, and not limitation. Those skilled in the art can modify and vary the embodiments without departing from the spirit and scope of the present disclosure.

What is claimed is:

1. A balun device, comprising a first primary coil, a first secondary coil, a second primary coil and a second secondary coil,
   wherein a first terminal of the first primary coil is configured to receive a first differential signal, and a second terminal of the first primary coil is configured to output a first in-phase component corresponding to the first differential signal;
   the first secondary coil corresponds to the first primary coil, a first terminal of the first secondary coil is configured to output a first orthogonal component orthogonal to the first in-phase component, and a second terminal of the first secondary coil is coupled to an AC ground;
   a first terminal of the second primary coil is configured to receive a second differential signal, and a second terminal of the second primary coil is configured to output a second in-phase component corresponding to the second differential signal;

the second secondary coil corresponds to the second primary coil, a first terminal of the second secondary coil is configured to output a second orthogonal component orthogonal to the second in-phase component, and a second terminal of the second secondary coil is coupled to the AC ground; and a phase difference between the first differential signal and the second differential signal is 180°, a phase difference between the first in-phase component and the second in-phase component is 180°, and a phase difference between the first orthogonal component and the second orthogonal component is 180°.

2. A differential phase shifter, comprising the balun device according to claim 1, an in-phase component gain amplifier, an orthogonal component gain amplifier and a transformer, wherein a first input terminal of the in-phase component gain amplifier is configured to receive the first in-phase component, a second input terminal of the in-phase component gain amplifier is configured to receive the second in-phase component, one of two output terminals of the in-phase component gain amplifier is coupled to a first terminal of a primary coil of the transformer, and the other of the two output terminals of the in-phase component gain amplifier is coupled to a second terminal of the primary coil of the transformer;

a first input terminal of the orthogonal component gain amplifier is configured to receive the first orthogonal component, a second input terminal of the orthogonal component gain amplifier is configured to receive the second orthogonal component, one of two output terminals of the orthogonal component gain amplifier is coupled to the first terminal of the primary coil of the transformer, and the other of the two output terminals of the orthogonal component gain amplifier is coupled to the second terminal of the primary coil of the transformer;

a secondary coil of the transformer is configured to output a phase shift signal; and an input signal at the first terminal of the primary coil of the transformer is orthogonal to an input signal at the second terminal of the primary coil of the transformer.

3. The differential phase shifter according to claim 2, wherein the in-phase component gain amplifier comprises at least one of a first amplifying unit or a second amplifying unit, wherein a first input terminal of the first amplifying unit is configured to receive the first in-phase component, a second input terminal of the first amplifying unit is configured to receive the second in-phase component, a first output terminal of the first amplifying unit is coupled to the first terminal of the primary coil of the transformer, and a second output terminal of the first amplifying unit is coupled to the second terminal of the primary coil of the transformer; and a first input terminal of the second amplifying unit is configured to receive the first in-phase component, a second input terminal of the second amplifying unit is configured to receive the second in-phase component, a first output terminal of the second amplifying unit is coupled to the first terminal of the primary coil of the transformer, and a second output terminal of the second amplifying unit is coupled to the second terminal of the primary coil of the transformer.

4. The differential phase shifter according to claim 3, wherein the in-phase component gain amplifier further comprises a first gain control unit, wherein when the in-phase component gain amplifier comprises the first amplifying unit, an output terminal of the first gain control unit is coupled to a power terminal of the first amplifying unit, and an input terminal of the first gain control unit is configured to receive an in-phase component gain coefficient;

when the in-phase component gain amplifier comprises the second amplifying unit, the output terminal of the first gain control unit is coupled to a power terminal of the second amplifying unit, and the input terminal of the first gain control unit is configured to receive the in-phase component gain coefficient; and when the in-phase component gain amplifier comprises the first amplifying unit and the second amplifying unit, the output terminal of the first gain control unit is coupled to the power terminal of the first amplifying unit and the power terminal of the second amplifying unit respectively, and the input terminal of the first gain control unit is configured to receive the in-phase component gain coefficient.

5. The differential phase shifter according to claim 4, wherein when the in-phase component gain amplifier merely comprises the first amplifying unit, the first amplifying unit comprises a first NMOS transistor and a second NMOS transistor, wherein a gate of the first NMOS transistor is configured to receive the first in-phase component, a source of the first NMOS transistor is coupled to a DC ground, and a drain of the first NMOS transistor is the second output terminal of the first amplifying unit; and a gate of the second NMOS transistor is configured to receive the second in-phase component, a source of the second NMOS transistor is coupled to the DC ground, and a drain of the second NMOS transistor is the first output terminal of the first amplifying unit.

6. The differential phase shifter according to claim 5, wherein the first gain control unit comprises a third NMOS transistor and a fourth NMOS transistor, wherein a drain of the third NMOS transistor is coupled to the source of the first NMOS transistor and the source of the second NMOS transistor, a gate of the third NMOS transistor is configured to receive a preset bias voltage, and a source of the third NMOS transistor is coupled to a drain of the fourth NMOS transistor; and a gate of the fourth NMOS transistor is configured to receive the in-phase component gain coefficient, and a source of the fourth NMOS transistor is coupled to the DC ground.

7. The differential phase shifter according to claim 4, wherein when the in-phase component gain amplifier merely comprises the second amplifying unit, the second amplifying unit comprises a fifth NMOS transistor and a sixth NMOS transistor, wherein a gate of the fifth NMOS transistor is configured to receive the first in-phase component, a source of the fifth NMOS transistor is coupled to a DC ground, and a drain of the fifth NMOS transistor is the first output terminal of the second amplifying unit; and a gate of the sixth NMOS transistor is configured to receive the second in-phase component, a source of the sixth NMOS transistor is coupled to the DC ground, and a drain of the sixth NMOS transistor is the second output terminal of the second amplifying unit.

8. The differential phase shifter according to claim 7, wherein the first gain control unit comprises a fourth NMOS transistor and a seventh NMOS transistor,
  wherein a drain of the seventh NMOS transistor is coupled to the source of the fifth NMOS transistor and the source of the sixth NMOS transistor, a gate of the seventh NMOS transistor is configured to receive a preset bias voltage, and a source of the seventh NMOS transistor is coupled to a drain of the fourth NMOS transistor; and
  a gate of the fourth NMOS transistor is configured to receive the in-phase component gain coefficient, and a source of the fourth NMOS transistor is coupled to the DC ground.

9. The differential phase shifter according to claim 4, wherein the in-phase component gain amplifier comprises the first amplifying unit and the second amplifying unit,
  wherein the first amplifying unit comprises a first NMOS transistor and a second NMOS transistor, wherein a gate of the first NMOS transistor is configured to receive the first in-phase component, a source of the first NMOS transistor is coupled to a DC ground, a drain of the first NMOS transistor is the second output terminal of the first amplifying unit, a gate of the second NMOS transistor is configured to receive the second in-phase component, a source of the second NMOS transistor is coupled to the DC ground, and a drain of the second NMOS transistor is the first output terminal of the first amplifying unit; and
  the second amplifying unit comprises a fifth NMOS transistor and a sixth NMOS transistor, wherein a gate of the fifth NMOS transistor is configured to receive the first in-phase component, a source of the fifth NMOS transistor is coupled to the DC ground, a drain of the fifth NMOS transistor is the first output terminal of the second amplifying unit, a gate of the sixth NMOS transistor is configured to receive the second in-phase component, a source of the sixth NMOS transistor is coupled to the DC ground, and a drain of the sixth NMOS transistor is the second output terminal of the second amplifying unit.

10. The differential phase shifter according to claim 9, wherein the first gain control unit comprises a third NMOS transistor, a fourth NMOS transistor, a seventh NMOS transistor, a first switch circuit, a second switch circuit, a third switch circuit and a fourth switch circuit,
  wherein a drain of the third NMOS transistor is coupled to the source of the first NMOS transistor and the source of the second NMOS transistor, a gate of the third NMOS transistor is coupled to a first terminal of the first switch circuit and a first terminal of the second switch circuit, and a source of the third NMOS transistor is coupled to a drain of the fourth NMOS transistor;
  a drain of the seventh NMOS transistor is coupled to the source of the fifth NMOS transistor and the source of the sixth NMOS transistor, a gate of the seventh NMOS transistor is coupled to a first terminal of the third switch circuit and a first terminal of the fourth switch circuit, and a source of the seventh NMOS transistor is coupled to the drain of the fourth NMOS transistor;
  a gate of the fourth NMOS transistor is configured to receive the in-phase component gain coefficient, and a source of the fourth NMOS transistor is coupled to the DC ground;
  a second terminal of the first switch circuit is configured to receive a preset bias voltage;
  a second terminal of the second switch circuit is coupled to the DC ground;
  a second terminal of the third switch circuit is coupled to the DC ground; and
  a second terminal of the fourth switch circuit is configured to receive the preset bias voltage.

11. The differential phase shifter according to claim 2, wherein the orthogonal component gain amplifier comprises at least one of a third amplifying unit or a fourth amplifying unit,
  wherein a first input terminal of the third amplifying unit is configured to receive the first orthogonal component, a second input terminal of the third amplifying unit is configured to receive the second orthogonal component, a first output terminal of the third amplifying unit is coupled to the first terminal of the primary coil of the transformer, and a second output terminal of the third amplifying unit is coupled to the second terminal of the primary coil of the transformer; and
  a first input terminal of the fourth amplifying unit is configured to receive the second orthogonal component, a second input terminal of the fourth amplifying unit is configured to receive the first orthogonal component, a first output terminal of the fourth amplifying unit is coupled to the second terminal of the primary coil of the transformer, and a second output terminal of the fourth amplifying unit is coupled to the first terminal of the primary coil of the transformer.

12. The differential phase shifter according to claim 11, wherein the orthogonal component gain amplifier further comprises a second gain control unit,
  when the orthogonal component gain amplifier comprises the third amplifying unit, an output terminal of the second gain control unit is coupled to a power terminal of the third amplifying unit, and an input terminal of the second gain control unit is configured to receive an orthogonal component gain coefficient;
  when the orthogonal component gain amplifier comprises the fourth amplifying unit, the output terminal of the second gain control unit is coupled to a power terminal of the fourth amplifying unit, and the input terminal of the second gain control unit is configured to receive the orthogonal component gain coefficient; and
  when the orthogonal component gain amplifier comprises the third amplifying unit and the fourth amplifying unit, the output terminal of the second gain control unit is coupled to the power terminal of the third amplifying unit and the power terminal of the fourth amplifying unit respectively, and the input terminal of the second gain control unit is configured to receive the orthogonal component gain coefficient.

13. The differential phase shifter according to claim 12, wherein when the orthogonal component gain amplifier merely comprises the third amplifying unit, the third amplifying unit comprises an eighth NMOS transistor and a ninth NMOS transistor,
  wherein a gate of the eighth NMOS transistor is configured to receive the first orthogonal component, a source of the eighth NMOS transistor is coupled to a DC ground, and a drain of the eighth NMOS transistor is the second output terminal of the third amplifying unit; and
  a gate of the ninth NMOS transistor is configured to receive the second orthogonal component, a source of the ninth NMOS transistor is coupled to the DC ground, and a drain of the ninth NMOS transistor is the first output terminal of the third amplifying unit.

14. The differential phase shifter according to claim 13, wherein the second gain control unit comprises a tenth NMOS transistor and an eleventh NMOS transistor,
wherein a drain of the tenth NMOS transistor is coupled to the source of the eighth NMOS transistor and the source of the ninth NMOS transistor, a gate of the tenth NMOS transistor is configured to receive a preset bias voltage, and a source of the tenth NMOS transistor is coupled to a drain of the eleventh NMOS transistor; and a gate of the eleventh NMOS transistor is configured to receive the orthogonal component gain coefficient, and a source of the eleventh NMOS transistor is coupled to the DC ground.

15. The differential phase shifter according to claim 12, wherein when the orthogonal component gain amplifier merely comprises the fourth amplifying unit, the fourth amplifying unit comprises a twelfth NMOS transistor and a thirteenth NMOS transistor,
wherein a gate of the twelfth NMOS transistor is configured to receive the first orthogonal component, a source of the twelfth NMOS transistor is coupled to a DC ground, and a drain of the twelfth NMOS transistor is the first output terminal of the fourth amplifying unit; and a gate of the thirteenth NMOS transistor is configured to receive the second orthogonal component, a source of the thirteenth NMOS transistor is coupled to the DC ground, and a drain of the thirteenth NMOS transistor is the second output terminal of the fourth amplifying unit.

16. The differential phase shifter according to claim 15, wherein the second gain control unit comprises an eleventh NMOS transistor and a fourteenth NMOS transistor,
wherein a drain of the fourteenth NMOS transistor is coupled to the source of the twelfth NMOS transistor and the source of the thirteenth NMOS transistor, a gate of the fourteenth NMOS transistor is configured to receive a preset bias voltage, and a source of the fourteenth NMOS transistor is coupled to a drain of the eleventh NMOS transistor; and a gate of the eleventh NMOS transistor is configured to receive the orthogonal component gain coefficient, and a source of the eleventh NMOS transistor is coupled to the DC ground.

17. The differential phase shifter according to claim 12, wherein the orthogonal component gain amplifier comprises the third amplifying unit and the fourth amplifying unit,
wherein the third amplifying unit comprises an eighth NMOS transistor and a ninth NMOS transistor, wherein a gate of the eighth NMOS transistor is configured to receive the first orthogonal component, a source of the eighth NMOS transistor is coupled to a DC ground, a drain of the eighth NMOS transistor is the second output terminal of the third amplifying unit, a gate of the ninth NMOS transistor is configured to receive the second orthogonal component, a source of the ninth NMOS transistor is coupled to the DC ground, and a drain of the ninth NMOS transistor is the first output terminal of the third amplifying unit; and the fourth amplifying unit comprises a twelfth NMOS transistor and a thirteenth NMOS transistor, wherein a gate of the twelfth NMOS transistor is configured to receive the first orthogonal component, a source of the twelfth NMOS transistor is coupled to the DC ground, a drain of the twelfth NMOS transistor is the first output terminal of the fourth amplifying unit, a gate of the thirteenth NMOS transistor is configured to receive the second orthogonal component, a source of the thirteenth NMOS transistor is coupled to the DC ground, and a drain of the thirteenth NMOS transistor is the second output terminal of the fourth amplifying unit.

18. The differential phase shifter according to claim 17, wherein the second gain control unit comprises a tenth NMOS transistor, an eleventh NMOS transistor, a fourteenth NMOS transistor, a fifth switch circuit, a sixth switch circuit, a seventh switch circuit and an eighth switch circuit,
wherein a drain of the tenth NMOS transistor is coupled to the source of the eighth NMOS transistor and the source of the ninth NMOS transistor, a gate of the tenth NMOS transistor is coupled to a first terminal of the fifth switch circuit and a first terminal of the sixth switch circuit, and a source of the tenth NMOS transistor is coupled to a drain of the eleventh NMOS transistor;

a drain of the fourteenth NMOS transistor is coupled to the source of the twelfth NMOS transistor and the source of the thirteenth NMOS transistor, a gate of the fourteenth NMOS transistor is coupled to a first terminal of the seventh switch circuit and a first terminal of the eighth switch circuit, and a source of the fourteenth NMOS transistor is coupled to the drain of the eleventh NMOS transistor;

a gate of the eleventh NMOS transistor is configured to receive the in-phase component gain coefficient, and a source of the eleventh NMOS transistor is coupled to the DC ground;

a second terminal of the fifth switch circuit is configured to receive a preset bias voltage;

a second terminal of the sixth switch circuit is coupled to the DC ground;

a second terminal of the seventh switch circuit is coupled to the DC ground; and a second terminal of the eighth switch circuit is configured to receive the preset bias voltage.

19. The differential phase shifter according to claim 2, wherein a center point of the primary coil of the transformer is coupled to a DC voltage source.

* * * * *